United States Patent
Koerts et al.

(10) Patent No.: US 9,520,840 B2
(45) Date of Patent: Dec. 13, 2016

(54) CURRENT LIMITER

(71) Applicant: NXP B.V., Eindhoven (NL)

(72) Inventors: Mattheus Johan Koerts, Nijmegen (NL); Fred Mostert, Gelderland (NL); Fre Jorrit Jorritsma, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/597,940

(22) Filed: Jan. 15, 2015

(65) Prior Publication Data

US 2016/0211811 A1 Jul. 21, 2016

(51) Int. Cl.
*H03F 3/217* (2006.01)
*H03F 1/52* (2006.01)
*H03F 3/183* (2006.01)
*H03F 3/21* (2006.01)

(52) U.S. Cl.
CPC .............. *H03F 1/523* (2013.01); *H03F 1/52* (2013.01); *H03F 3/183* (2013.01); *H03F 3/211* (2013.01); *H03F 3/2171* (2013.01); *H03F 3/2173* (2013.01); *H03F 2200/03* (2013.01); *H03F 2200/351* (2013.01); *H03F 2203/21139* (2013.01)

(58) Field of Classification Search
CPC .............. H03F 3/38; H03F 3/217; H03F 1/52

USPC .................... 330/10, 207 A, 207 P, 251, 298
See application file for complete search history.

(56) References Cited

U.S. PATENT DOCUMENTS

| | | | |
|---|---|---|---|
| 7,649,414 B2 * | 1/2010 | Kaya | H03F 3/217 330/251 |
| 2006/0262473 A1 | 11/2006 | Neesgaard et al. | |
| 2010/0109773 A1 | 5/2010 | Takagi | |
| 2012/0014025 A1 | 1/2012 | Sato et al. | |
| 2013/0285745 A1 | 10/2013 | Frits | |

FOREIGN PATENT DOCUMENTS

| | | |
|---|---|---|
| EP | 2 387 149 A1 | 11/2011 |
| WO | 2005/109631 A1 | 11/2005 |

OTHER PUBLICATIONS

Partial Extended European Search Report for Patent Appln. No. 16151354.4 (Jun. 23, 2016).

* cited by examiner

Primary Examiner — Steven J Mottola

(57) ABSTRACT

A current limiter for Class-D amplifiers measures and stores a position of an over-current event. By comparing the stored position, output signals can be selectively inverted. As a result, the Class-D amplifier remains in a defined modulation scheme even during period of current limiting.

17 Claims, 9 Drawing Sheets

CURRENT LIMITER

TECHNICAL FIELD

Various embodiments disclosed herein relate generally to current limiters, for example, current limiters for Class D amplifiers.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of an embodiment adequate to allow those of ordinary skill in the art to make and use the inventive concepts will follow in later sections.

Various embodiments relate to a current limiter for a class D amplifier, the current limiter comprising: an over-current protection (OCP) block coupled to both a first side and a second side of the class D amplifier, wherein the OCP block further comprises: a plurality of over-current detecting (OCD) inputs; a plurality of OCP count blocks coupled to the plurality of OCD inputs; an OCP minimum position block coupled to the plurality of OCP count blocks; and a plurality of comparators coupled to the OCP minimum position block and configured to receive a plurality of running event position signals.

Further, various embodiments relate to wherein at least one OCD input of the plurality of OCD inputs further comprises a spike filter, wherein at least one spike filter is coupled between a respective OCD input and a respective OCP count block. At least one OCP count block of the plurality of OCP count blocks may be configured to measure an OCD event position. At least one OCP count block of the plurality of OCP count blocks may be configured to store the measured OCD event position. The OCP minimum position block may be configured to select an OCD event position from the plurality of OCP count blocks.

Further, various embodiments relate to wherein the OCP minimum position block may be configured to select the most stringent OCD event position. At least one comparator of the plurality of comparators may be configured to compare a selected OCD event position from the OCP minimum position block with a particular running event position. At least one comparator of the plurality of comparators may be configured to generate an invert signal that flags which output of a respective block in the class D amplifier needs to be inverted.

Also, various embodiments relate to a method of limiting currents for a class D amplifier, the method comprising: detecting an over-current event; storing a position of the over-current event as an OCD position; comparing the stored OCD position to a PWM carrier position; and inverting a PWM signal when the PWM carrier position is equal to the stored OCD position. Further, various embodiments relate to measuring a plurality of OCD positions.

Additional embodiments relate to comparing the plurality of measured OCD positions to a threshold; and selecting a most stringent OCD position from the plurality of measured OCD positions. Other embodiments relate to measuring the plurality of OCD positions with a sample and hold technique. Some embodiments relate to using a spike filter on input data before detecting the over-current event.

Further embodiments relate to comparing a selected OCD position with a particular running event position. Still other embodiments relate to holding the stored OCD position for two PWM carrier edges. Various embodiments relate to comparing a duty cycle to a predetermined threshold and determining, when the duty cycle exceeds the predetermined threshold, that a short circuit is present.

BRIEF DESCRIPTION OF THE DRAWINGS

In order to better understand various embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
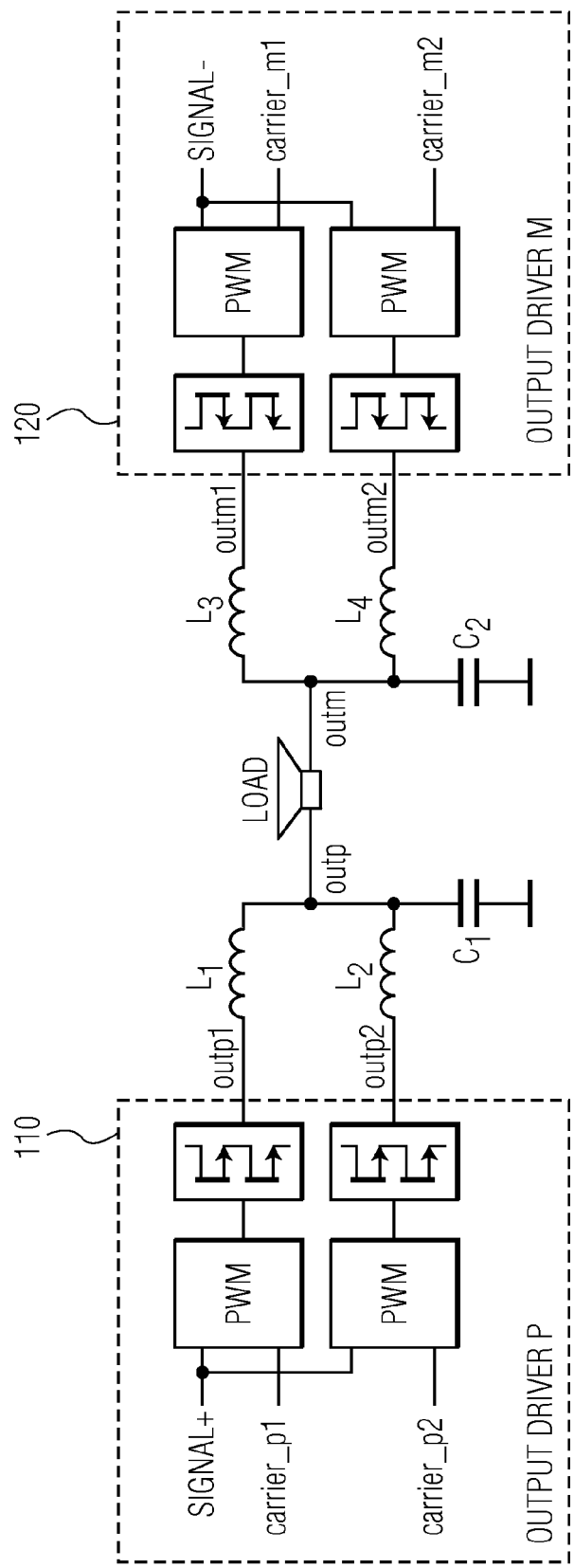
FIG. 1 illustrates a Class D amplifier.

FIG. 1 illustrates a Class D amplifier 100. Class D amplifier 100 may include a positive output driver 110 and a negative output driver 120. Each output driver 110/120 may comprise two Pulse Width Modulators (PWMs) and two output stages. Each output driver 110/120 may be implemented on an Integrated Circuit (IC).

Respective inductors and capacitors may couple each output driver 110/120 to a load. The inductors, capacitors, and load are external to the IC. While a Class D amplifier is an electronic amplifier, it may also be configured to function as a switch. Thus, amplifiers like Class D amplifier 100 are also known as switching amplifiers.

When applied to a loudspeaker, Class D amplifier 100 may have two of its four output stages connected to a positive terminal of the loudspeaker. The remaining two output stages may be connected to the negative terminal of the loudspeaker. In this configuration, an increase in an audio signal will increase the duty cycle in the output stages coupled to the positive terminal of the loudspeaker, while decreasing the duty cycle in the output stages coupled to the negative terminal of the loudspeaker.

Class-D amplifier 100 may operate in at least four different modulation schemes. In two of these schemes, interleaving may occur. Current limiting may be necessary to prevent excessive output currents from flowing out of Class-D amplifier 100. However, as described below, current limiting may have two drawbacks.

First, limiting the output current from Class-D amplifier 100 may cause it to "fall out of modulation scheme." If individual outputs from Class-D amplifier 100 are subjected to current limiting, the phase relation between the outputs may be distortion. Such distortion is especially likely if each output is independently subject to current limiting.

Second, limiting the output current from Class-D amplifier 100 may create a circulating current for interleaved modulation schemes. Limiting one phase of an interleaved output may generate a voltage difference relative to another phase. This voltage difference may create a circulating current that further distorts operation of Class-D amplifier 100.

Figure 2:
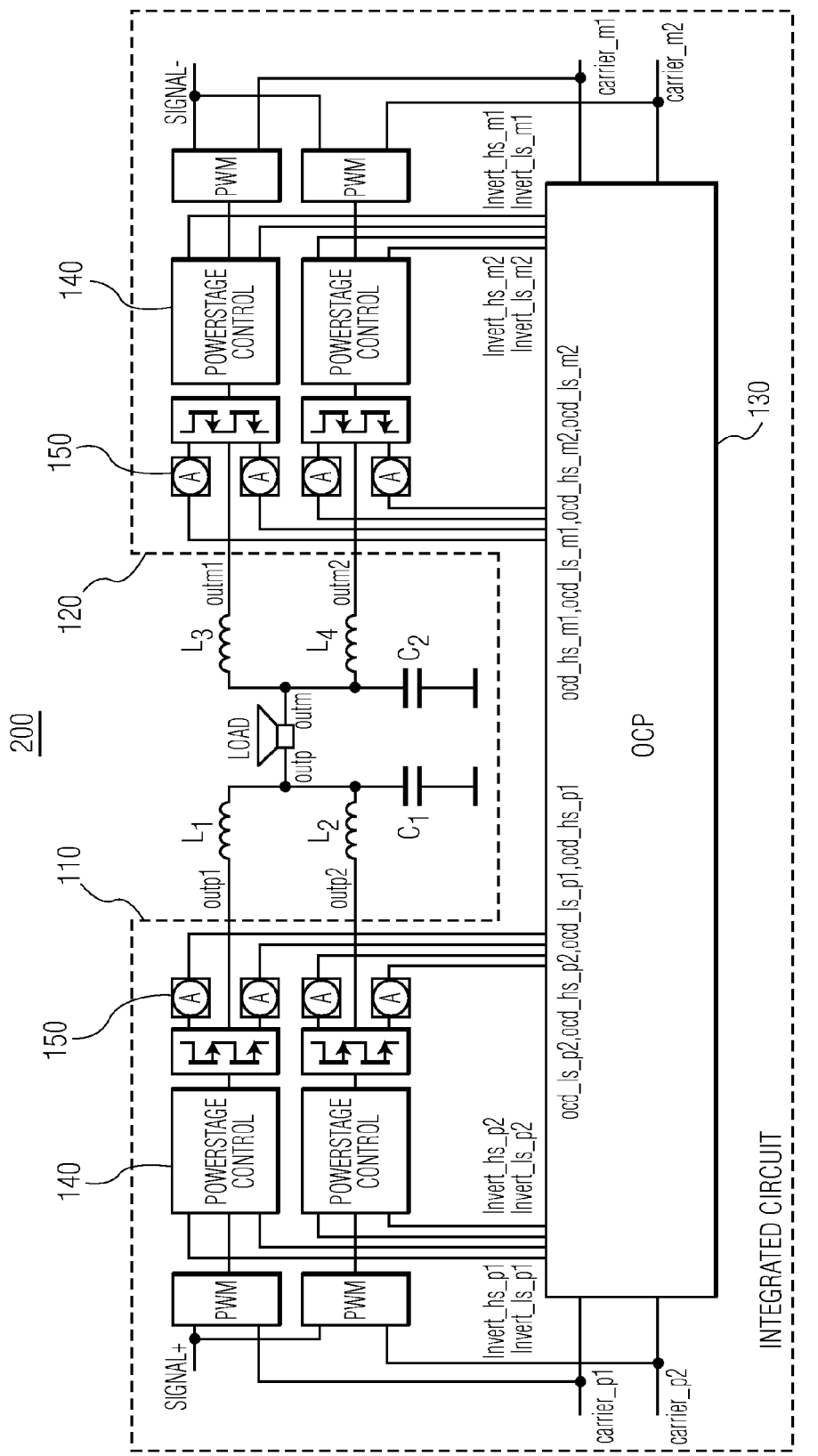
FIG. 2 illustrates a current limiter with the Class D amplifier of FIG. 1.

FIG. 2 illustrates a current limiter 200 with Class D amplifier 100. Current limiter 200 may apply control signals to both output drivers 110/120 of the class D amplifier 100. As depicted in FIG. 2, the OCP block 130 may produce four control signals for each output driver 110/120. Current limiter 200 may provide over-current protection (OCP) for Class D amplifier 100.

OCP block 130 may apply the four control signals to two power stage control blocks 140 within each output driver 110/120. OCP block 130 may also receive four OCD signals from four respective amplifiers 150 within each output driver 110/120. In this way, as described in further detail below, OCP block 130 may both detect an over-current condition and control inversion of signals within each output driver 110/120.

Figure 3:
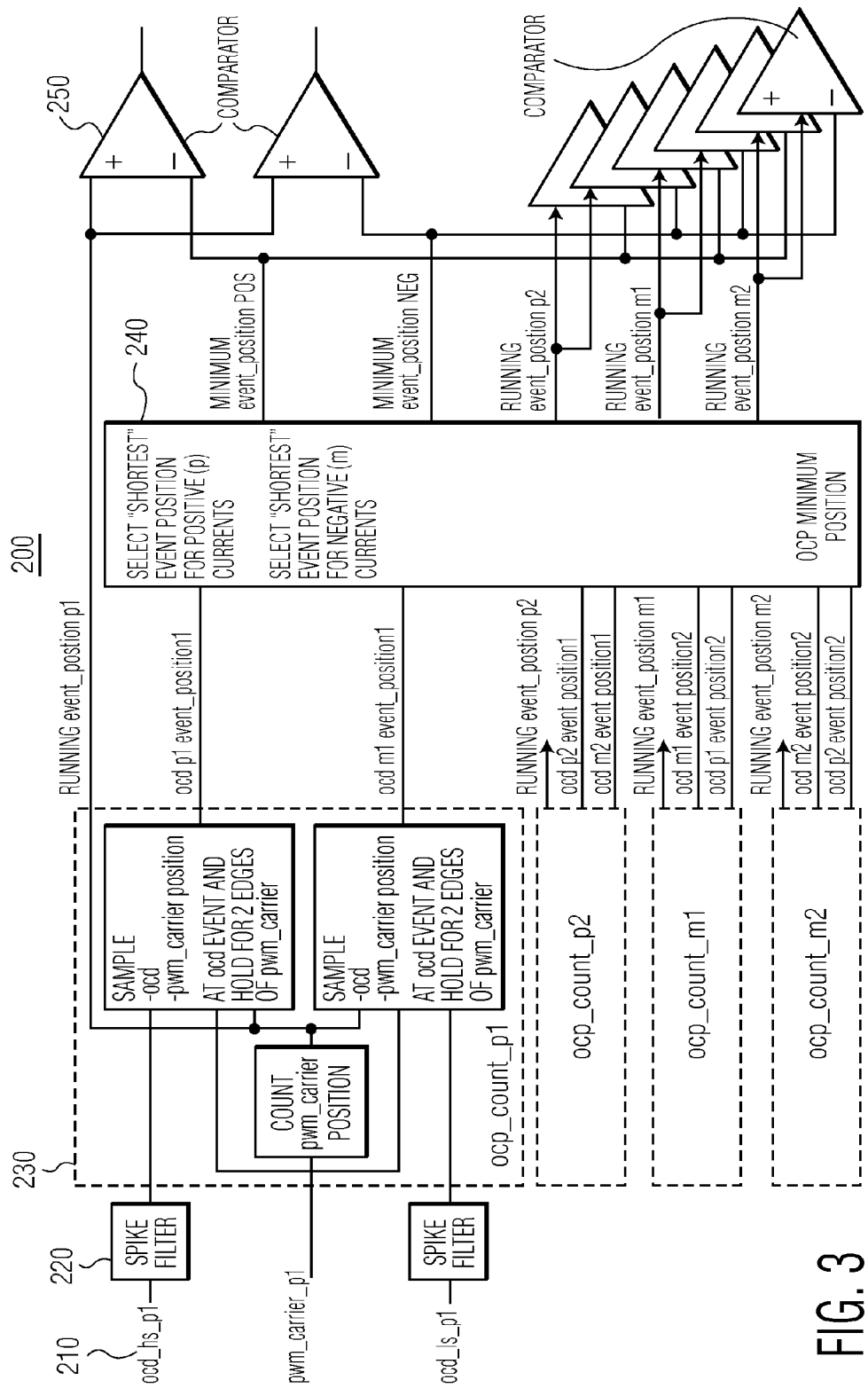
FIG. 3 illustrates details of the current limiter of FIG. 2.

FIG. 3 illustrates further details of current limiter 200. Current limiter 200 may include a plurality of over-current detecting (OCD) inputs 210, a plurality of spike filters 220, a plurality of OCP count blocks 230, OCP minimum position block 240, and a plurality of comparators 250.

The OCD inputs 210 receive PWM signals from both output drivers 110/120 of the class D amplifier 100. In particular, the OCD inputs 210 may detect PWM signals that could potentially damage either the Integrated Circuit (IC) or the load.

Each OCD input 210 may be coupled to a respective spike filter 220. The spike filter 220 may operate upon a raw input signal, producing an output that can be used more accurately by the plurality of OCP count blocks 230. In particular, the spike filter 220 may remove unwanted transients, thereby providing data to the plurality of OCP count blocks 220 that can be measured in a more precise manner.

Each OCP count block 230 may be coupled to a filtered version through each spike filter 220 of each respective OCD input 210. The OCP count blocks 230 are able to measure a position of an OCD event and store the OCD event position.

In particular, each OCP count block 230 may have three functions: to count a PWM carrier position, to sample and hold the counted PWM carrier position at a corresponding OCD event, and to hold this position for the next two PWM carrier edges. The position may be held for both positive and negative PWM carrier edges.

The OCP minimum position block 240 is coupled to all of the OCP count blocks 230, enabling it to compare the stored OCD event positions. OCP minimum position block 240 may then select the most stringent of the stored OCD event positions for subsequent processing.

Each comparator 250 may be coupled to the OCP minimum position block 240. Thus, each comparator 250 compares a running event position to the OCD event position selected by the OCP minimum position block 240. Based upon these comparisons, each comparator 250 will flag whether the output signal needs to be inverted.

Each output of comparator 250 may be respectively applied to output drivers 110/120 of Class D amplifier 100. In particular, these outputs may be applied in a powerstage control block to PWM output signals. Thus, application of control signals for inversion of the PWM output signals may detect clipping of the PWM output signals, control the depth of the modulation when in 100% modulation, or make a minimum output pulse when not in 100% modulation. In addition, the control signals may invert some of the PWM output signals according to a state machine implementation.

Figure 4:
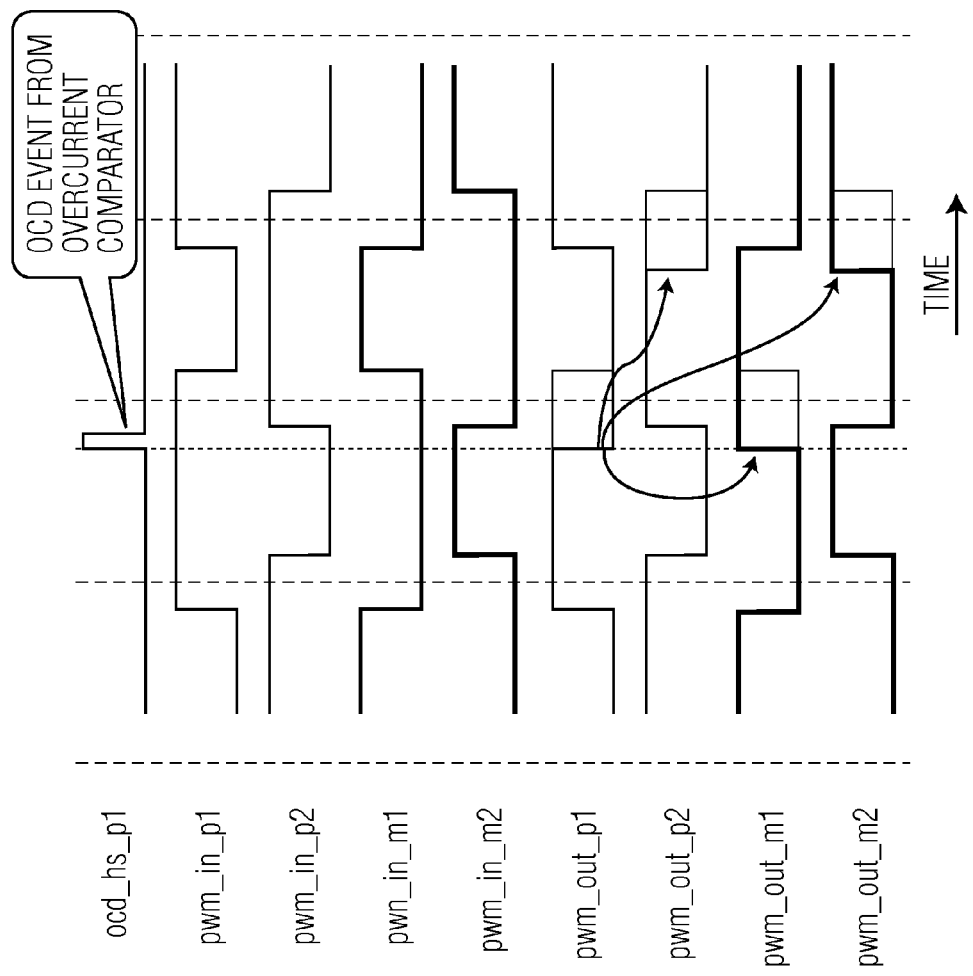
FIG. 4 illustrates compensation for circulating currents.

FIG. 4 illustrates compensation for circulating currents.

Circulating currents may occur for interleaved modulation schemes. To compensate for the circulating currents, both outputs (outp1 and outp2) need to react to an over-current event in such a way that they deliver the same amount of energy to the load within each PWM-period, wherein the period is proportional to the frequency of the PWM carrier signal. Within a PWM period, the duty cycles of outp1 and outp2 should be substantially equal. Likewise, the duty cycles for outm1 and outm2 should be substantially equal.

A circuit (powerstage_control) that modifies the PWM carrier signal is placed between the PWM and the output stage. Input and output signals of this powerstage_control circuit are depicted during an excessive current event from the excessive current comparator for outp1. The pwm_in_p1/2 signals from the PWM have a particular duty cycles that are related to output voltages of the amplifier. When a current is too large, the ocd_hs_p1 signal from the excessive current comparator of outp1 is activated. The powerstage_control circuit then inverts pwm_out_p1 to limit the output current. As a consequence, the pulse width of pwm_out_p1 is now smaller than pwm_in_p1. Next, the pulse width of pwm_out_p2 is made substantially equal to the pulse width of pwm_out_p1. Prior to this adjustment, pwm_in_p1 and pwm_in_p2 are not substantially identical because they are made by independent PWMs. As a result of this adjustment, the circulating currents may be substantially eliminated.

Figure 5:
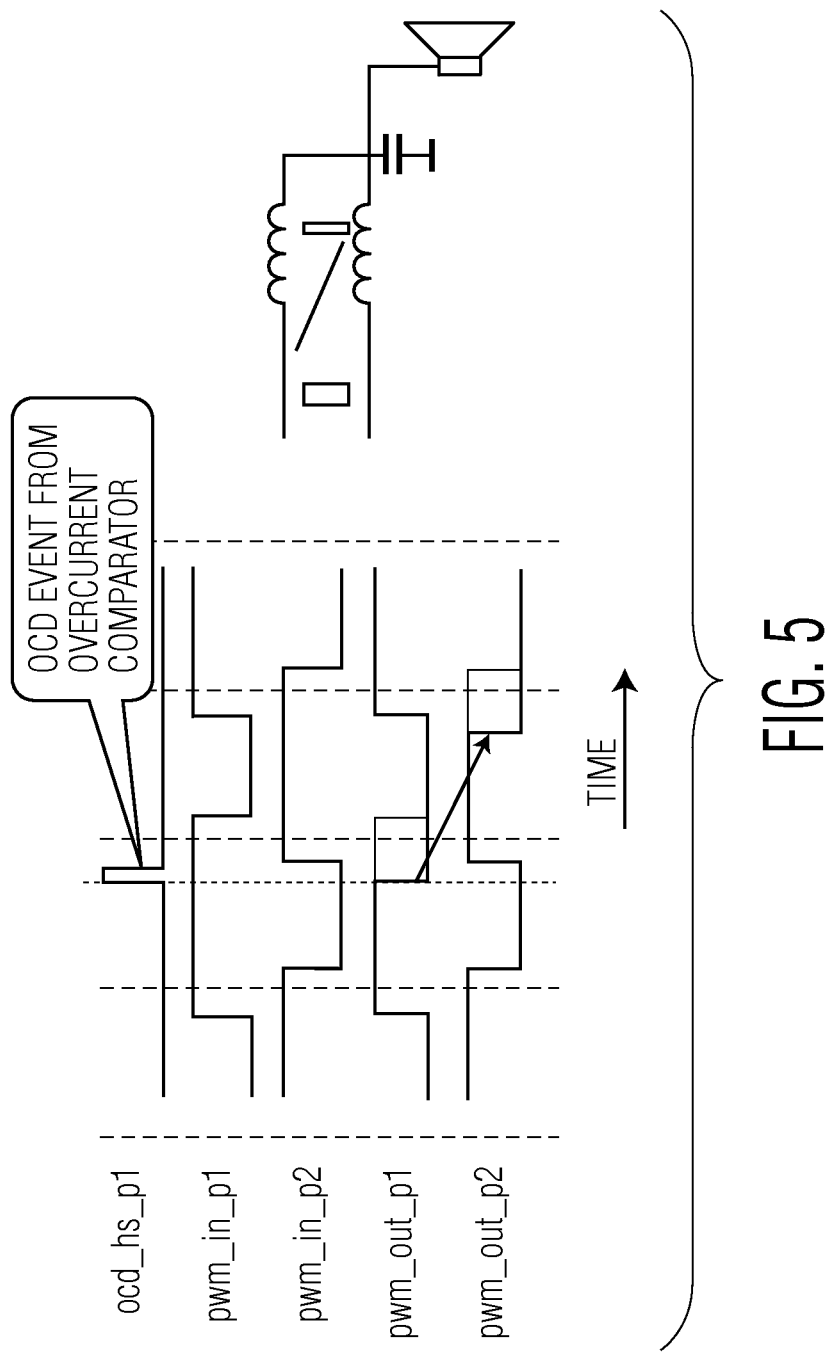
FIG. 5 illustrates compensation for falling out of modulation.

FIG. 5 illustrates compensation for falling out of modulation.

Compensation for circulating currents can be extended to all output phases. In a four phase embodiment, such compensation would apply to the p1, p2, m1, and m2 outputs. In addition to working for interleaved 1 & 2 modulation schemes, such compensation may also be applicable to AD and BD modulation schemes. Interleaving 1 modulation schemes involve carrier phases that alternate between 0 and 180 degrees. Outp1 and outp2 may be 0 degrees, while outm1 and outm2 may be 180 degrees. Interleaving 2 modulation schemes have the carriers of outm1 and outm2 shifted 90 degrees compared to outp1 and outp2, resulting in carrier phases spaced at quadrants of 0, 90, 180, and 270 degrees.

In contrast, for an AD modulation schemes, outp1 and outp2 are substantially equal. Outm1 and outm2 are shifted 180 degrees compared to outp1 and outp2. For a BD modulation scheme, all outputs have the same phase.

For interleaved 1 modulation, the duty cycles of outp1 and oup2 may be 66% while the duty cycles of outm1 and outm2 may be 33%. As a consequence, the load may have a positive output voltage. After detecting an excessive current at the current comparator of output p1, inversion of pwm_out_p1 should occur.

Figure 6:
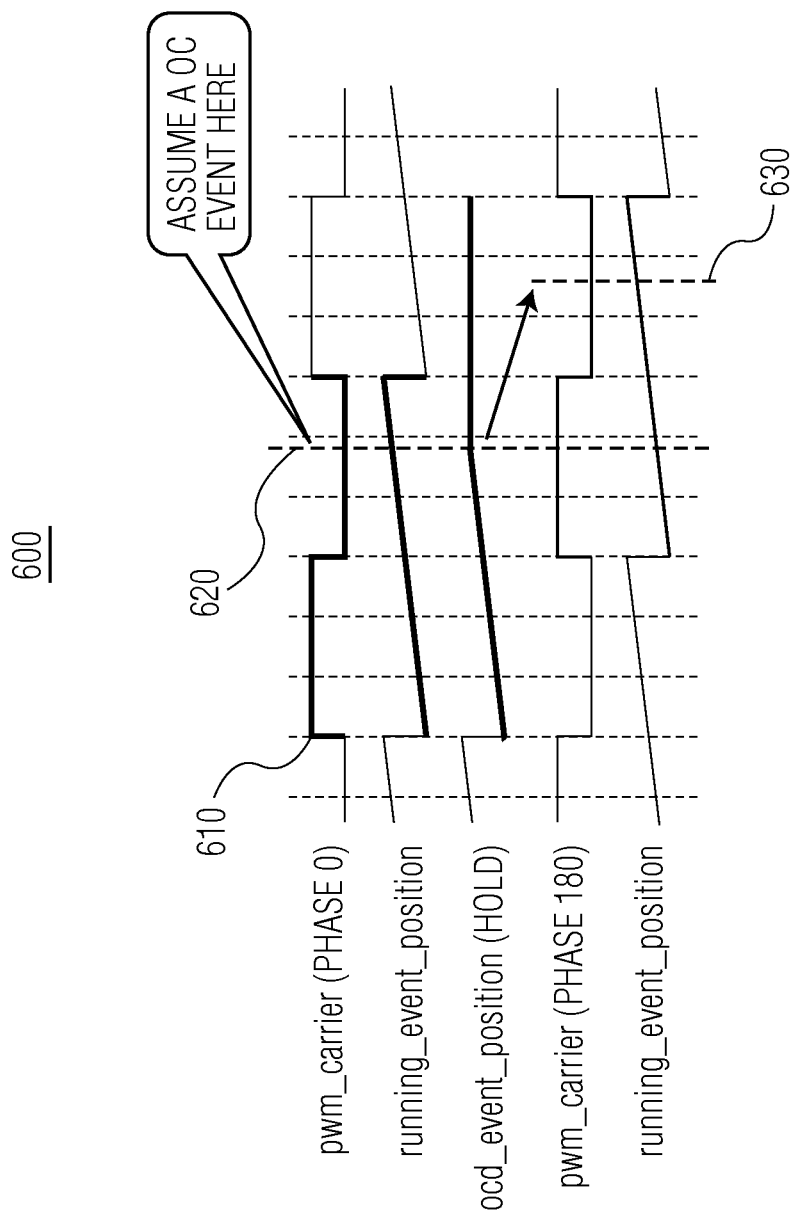
FIG. 6 illustrates a chart for generation of the ocp_count signals.

FIG. 6 illustrates a chart 600 for generation of the ocp_count signals.

The ocp_count block may have multiple functions, such as counting the pwm_carrier position, sampling and holding the counted position when an excessive current event occurs, and continuing to hold the position for the next two PWM carrier edges. The carrier edges may be either positive or negative. Each output (outp1, outp2, outm1, and outm2) may have a respective own ocp_count block.

After the sensor detects an excessive current event at running event position 610, the phase (pwm_carrier, phase 0) gets the detection signal from the sensor at the time 620, marked with the first dashed line. The value of a counter, starting at the rising edge of the pwm-carrier, is stored by a sample and hold technique. This is the ocd_event_position 620.

Because the running_event_position 610 is larger than the stored ocd_event_position 620 the output signal should be inverted. After enough time has elapsed to reach time 630 the running_event_position 610 becomes larger than the stored ocd_event_position 620. Thus, this output should also be inverted.

Figure 7:
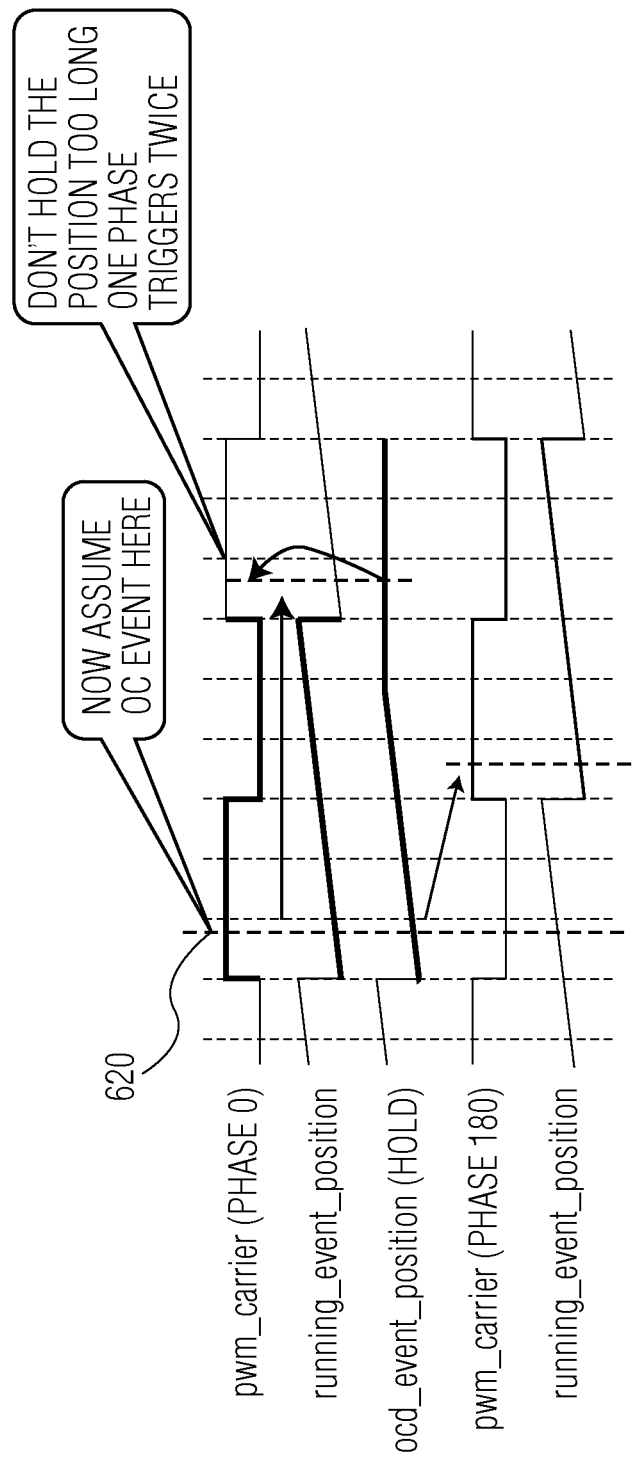
FIG. 7 illustrates timing for the ocd_event_position.

FIG. 7 illustrates timing for the ocd_event_position 620.

The ocd_event_position 620 may be stored for more than one cycle of the pwm_carrier. However, storing it for more than three cycles may have diminishing returns. Thus, the ocd_event_position 620 may be stored for two of the pwm-carrier edges after an ocd-event.

Figure 8:
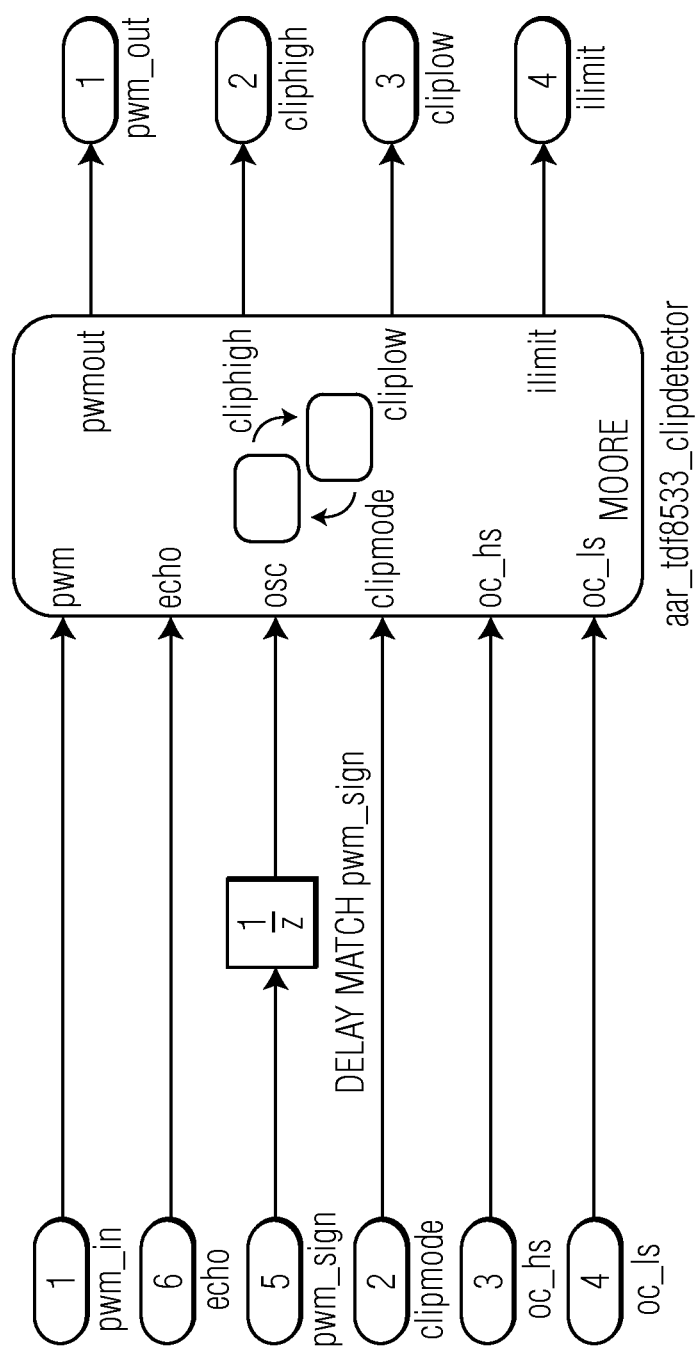
FIG. 8 illustrates a powerstage control technique.

FIG. 8 illustrates a powerstage control technique.

The powerstage_control block may be located between the PWM and the power stage. The ocp block may send eight invert_xx_xx signals, which in one example embodiment includes the eight invert_xx_xx signals shown in FIG. 2, to four powerstage_control blocks. Each powerstage_control block may have at least four functions: detect clipping of the outputs, control the modulation depth, make a minimum output pulse when not in 100% modulation, and selectively invert the PWM signals based on invert_xx_xx signals. These functions may be implemented in a state machine, which controls the pwm-signal to the power stage.

Figure 9:
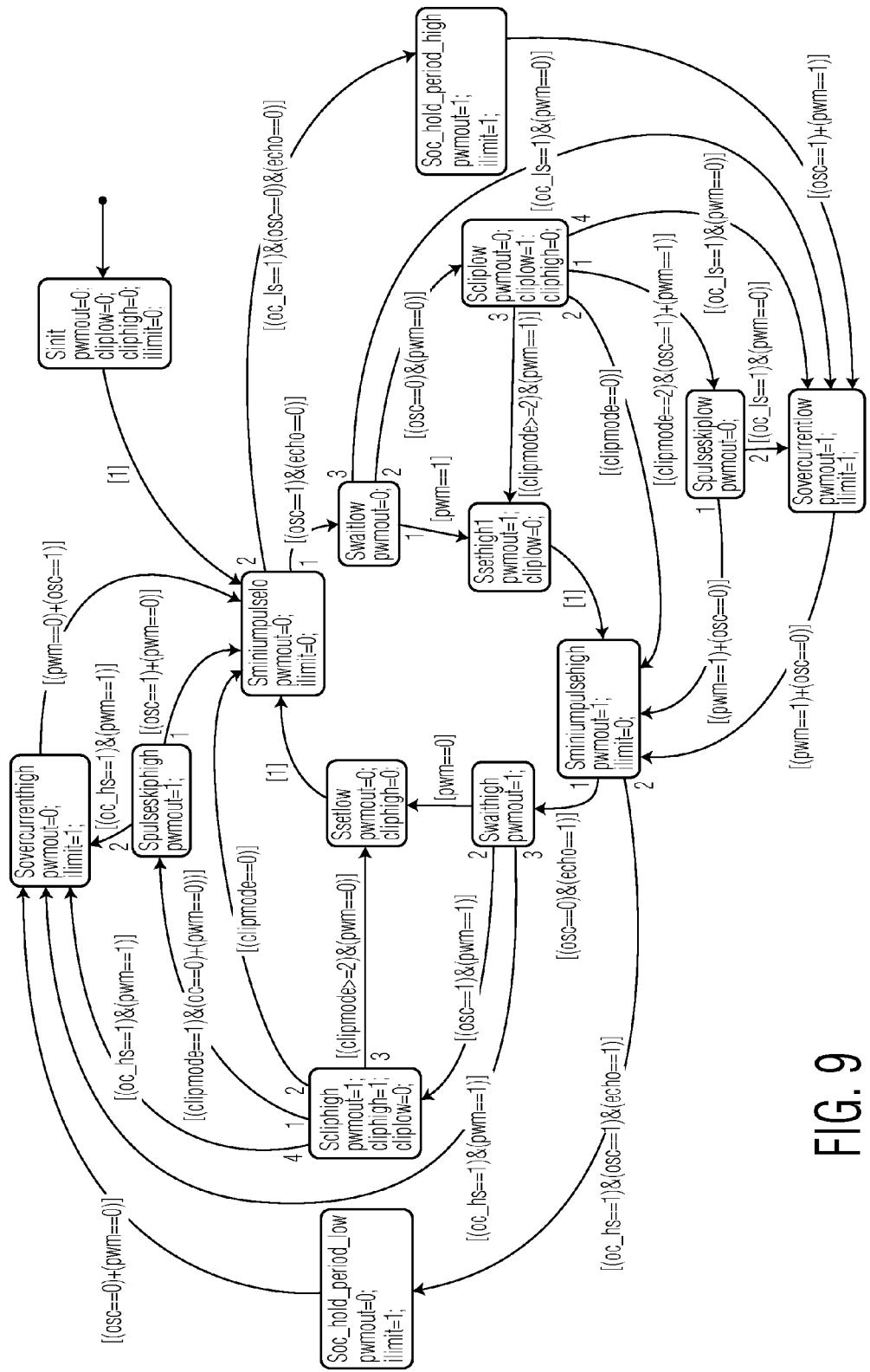
FIG. 9 illustrates a state machine.

FIG. 9 illustrates a state machine.

During normal operation, when there is no clipping and no excessive current events occur, the state machine runs through the inner six states as controlled by the pwm_in signal. These six states ensure that the pwm_out signal switches once per pwm-period. This maintains a minimum pulse width. The minimum pulse width may ensure that the output switching frequency remains fixed.

In a circle around these six states are four states which implement both clip detection and modulation depth control. The over current inversion function involves the four states located on the outer circle. For every state where the high side transistor of the power stage is on (pwm_out is high), a transition can be made to an over-current state. This transition is initiated by the invert_hs signal coming from the OCP block. The invert_ls signal may perform an analogous function for the low side.

When an invert_xx signal is received, the powerstage_control may invert the PWM signal and also activate the ilim signal. At the end of the PWM period, the inverted PWM signal transitions in the minimum pulse of the next PWM-period. When the duty cycle of the ilim signal is larger than a predefined threshold, a short circuit at the output may be present.

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

It should be appreciated by those skilled in the art that any block diagrams herein represent conceptual views of illustrative circuitry embodying the principles of the invention.

Although the various embodiments have been described in detail with particular reference to certain aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A current limiter for a class D amplifier, the current limiter comprising:
an over-current protection (OCP) block coupled to both a first side and a second side of the class D amplifier, wherein the OCP block further comprises:
a plurality of over-current detecting (OCD) inputs;
a plurality of OCP count blocks coupled to the plurality of OCD inputs;
an OCP minimum position block coupled to the plurality of OCP count blocks; and
a plurality of comparators coupled to the OCP minimum position block and configured to receive a plurality of running event position signals.

2. The current limiter of claim 1, wherein at least one OCD input of the plurality of OCD inputs further comprises a spike filter, wherein at least one spike filter is coupled between a respective OCD input and a respective OCP count block.

3. The current limiter of claim 1, wherein at least one OCP count block of the plurality of OCP count blocks is configured to measure an OCD event position.

4. The current limiter of claim 3, wherein at least one OCP count block of the plurality of OCP count blocks is configured to store the measured OCD event position.

5. The current limiter of claim 1, wherein the OCP minimum position block is configured to select an OCD event position from the plurality of OCP count blocks.

6. The current limiter of claim 5, wherein the OCP minimum position block is configured to select the most stringent OCD event position.

7. The current limiter of claim 1, wherein at least one comparator of the plurality of comparators is configured to compare a selected OCD event position from the OCP minimum position block with a particular running event position.

8. The current limiter of claim 7, wherein at least one comparator of the plurality of comparators is configured to generate an invert signal that flags which output of a respective block in the class D amplifier needs to be inverted.

9. A method of limiting currents for a class D amplifier, the method comprising:
- detecting an over-current event;
- storing a position of the over-current event as an OCD position;
- comparing the stored OCD position to a PWM carrier position; and
- inverting a PWM signal when the PWM carrier position is equal to the stored OCD position.

10. The method of claim 9, further comprising:
measuring a plurality of OCD positions.

11. The method of claim 10, further comprising:
- comparing the plurality of measured OCD positions to a threshold; and
- selecting a most stringent OCD position from the plurality of measured OCD positions.

12. The method of claim 10, further comprising:
measuring the plurality of OCD positions with a sample and hold technique.

13. The method of claim 9, further comprising:
using a spike filter on input data before detecting the over-current event.

14. The method of claim 9, further comprising:
comparing a selected OCD position with a particular running event position.

15. The method of claim 9, further comprising:
holding the stored OCD position for two PWM carrier edges.

16. The method of claim 9, further comprising:
comparing a duty cycle to a predetermined threshold.

17. The method of claim 16, further comprising:
determining, when the duty cycle exceeds the predetermined threshold, that a short circuit is present.

* * * * *